United States Patent
Chang et al.

(10) Patent No.: US 8,926,755 B2
(45) Date of Patent: Jan. 6, 2015

(54) LIFT-OFF DEPOSITION SYSTEM FEATURING A DENSITY OPTIMIZED HULA SUBSTRATE HOLDER IN A CONICAL DEPOSITION CHAMBER

(75) Inventors: Ping Chang, Danville, CA (US); Gregg Wallace, Little Silver, NJ (US)

(73) Assignee: Ferrotec (USA) Corporation, Santa Clara, CA (US)

( * ) Notice: Subject to any disclaimer, the term of this patent is extended or adjusted under 35 U.S.C. 154(b) by 471 days.

(21) Appl. No.: 12/765,005

(22) Filed: Apr. 22, 2010

(65) Prior Publication Data

US 2010/0272893 A1    Oct. 28, 2010

Related U.S. Application Data

(60) Provisional application No. 61/214,800, filed on Apr. 28, 2009, provisional application No. 61/216,093, filed on May 13, 2009.

(51) Int. Cl.
| | |
|---|---|
| C23C 16/00 | (2006.01) |
| C23C 14/24 | (2006.01) |
| C23C 14/04 | (2006.01) |
| C23C 14/50 | (2006.01) |

(52) U.S. Cl.
CPC .............. *C23C 14/24* (2013.01); *C23C 14/044* (2013.01); *C23C 14/505* (2013.01)
USPC ....................................................... 118/730

(58) Field of Classification Search
CPC .............. C23C 14/505; C23C 16/4584; H01L 21/0331; H01L 21/0272
USPC ........................................................... 118/730
See application file for complete search history.

(56) References Cited

U.S. PATENT DOCUMENTS 3,128,205 A * 4/1964 Illsley ........................... 118/730
3,643,625 A   2/1972 Mahl
(Continued)

FOREIGN PATENT DOCUMENTS

| JP | 58-128724 | 8/1983 |
| JP | 63149369 A | 6/1988 |

(Continued)

OTHER PUBLICATIONS

English translation of non-final office action dated Jun. 20, 2013 in a counterpart application from Taiwanese Intellectual Property Office.

*Primary Examiner* — Keath Chen
(74) *Attorney, Agent, or Firm* — Robert R. Deleault, Esq.; Mesmer & Deleault, PLLC

(57) ABSTRACT

A vapor deposition device using a lift-off process includes an evaporation source, a support frame mounted for rotation about a first axis that passes through the evaporation source, a central dome-shaped wafer holder mounted to the support frame wherein a centerpoint of the central dome-shaped wafer holder is aligned with the first axis, an orbital dome-shaped wafer holder mounted to the support frame in a position offset from the first axis and rotatable about a second axis that passes through a centerpoint of the orbital dome-shaped wafer holder and the evaporation source, and a plurality of wafer positions on the central dome-shaped wafer holder and the orbital dome-shaped wafer holder where each of the wafer positions are offset from the first axis and the second axis.

18 Claims, 4 Drawing Sheets

(56) References Cited

U.S. PATENT DOCUMENTS

| | | | |
|---|---|---|---|
| 3,858,547 A | | 1/1975 | Bergfelt |
| 4,547,279 A | * | 10/1985 | Kiyota et al. ............ 204/192.12 |
| 5,106,346 A | * | 4/1992 | Locher et al. .................... 475/11 |
| 5,320,877 A | * | 6/1994 | Nakaue et al. ................ 427/523 |
| 5,424,246 A | * | 6/1995 | Matsuo et al. ................ 438/642 |
| 5,447,750 A | | 9/1995 | Nishiguchi |
| 6,364,956 B1 | * | 4/2002 | Wang et al. ................... 118/726 |
| 6,509,061 B1 | | 1/2003 | Ida et al. |
| 2002/0139666 A1 | * | 10/2002 | Hsueh et al. ............. 204/298.03 |
| 2003/0180462 A1 | | 9/2003 | Chang et al. |
| 2008/0216741 A1 | * | 9/2008 | Ling et al. .................... 118/712 |

FOREIGN PATENT DOCUMENTS

| | | |
|---|---|---|
| JP | 04-318932 | 11/1992 |
| JP | 05-326507 | 12/1993 |
| JP | 08120443 A | 5/1996 |
| JP | 08-236449 | 9/1996 |
| JP | 10008242 A | 1/1998 |
| JP | 2002217132 | 8/2002 |

* cited by examiner

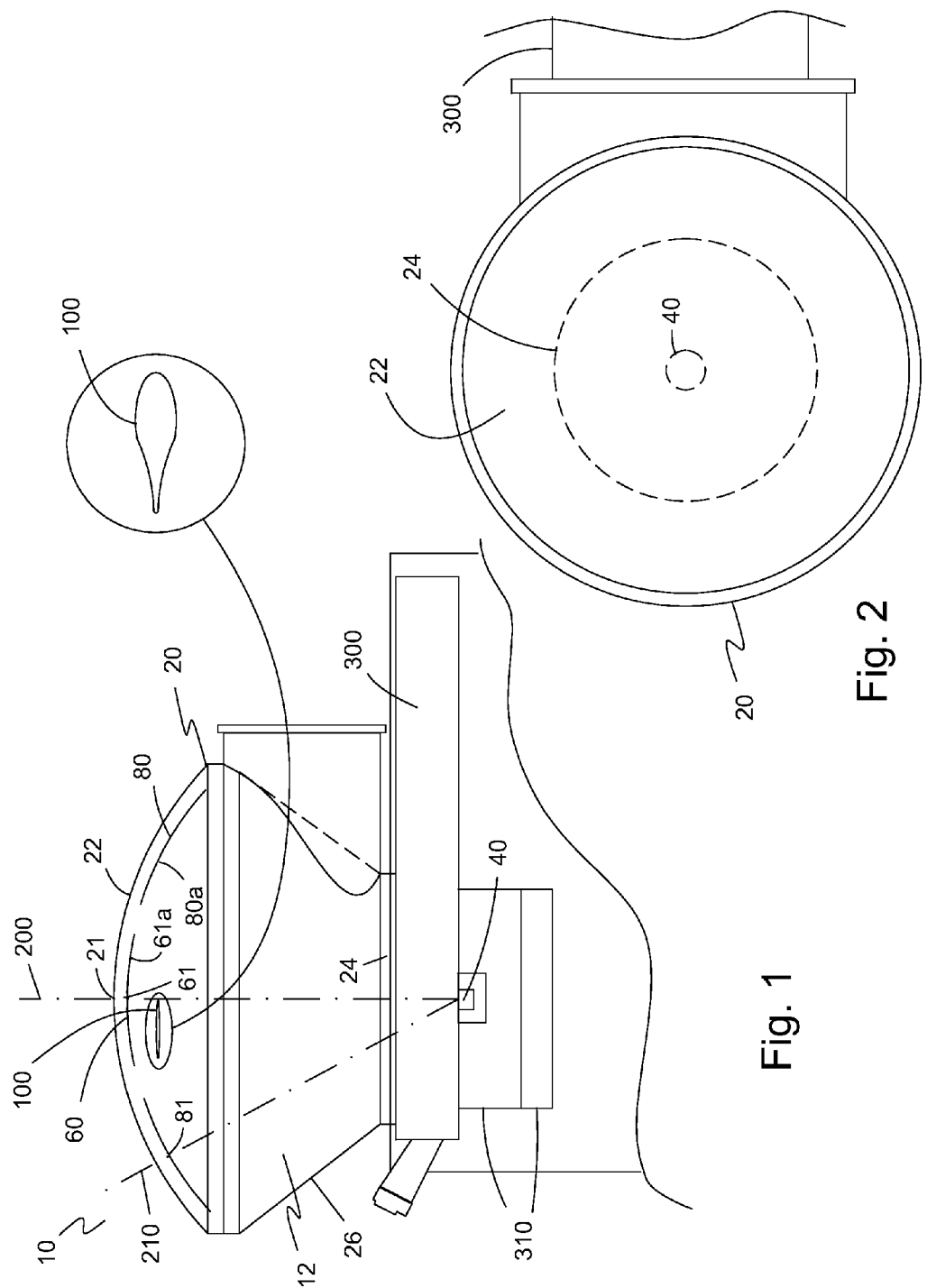

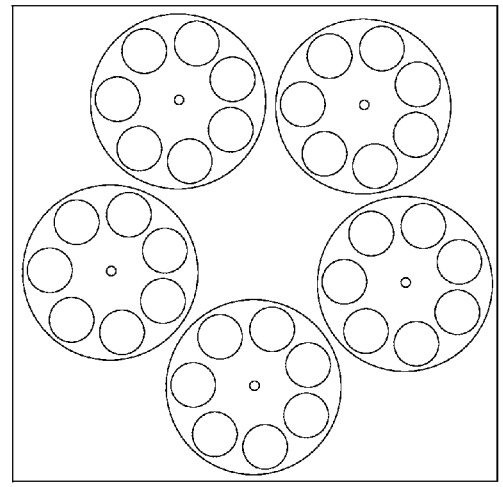
Fig. 6 - Prior Art
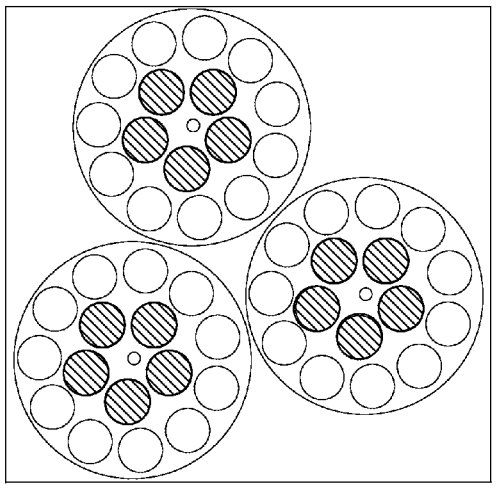
Fig. 7 - Prior Art
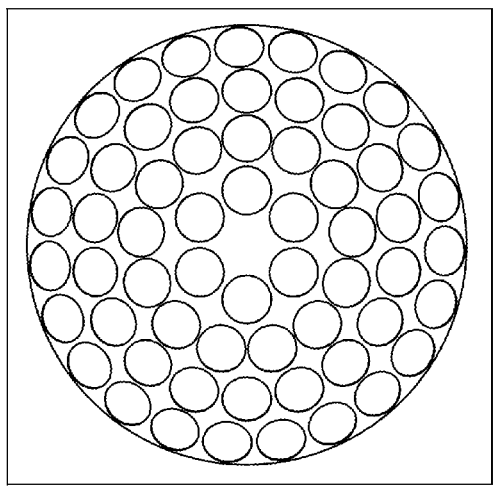
Fig. 5 - Prior Art

LIFT-OFF DEPOSITION SYSTEM FEATURING A DENSITY OPTIMIZED HULA SUBSTRATE HOLDER IN A CONICAL DEPOSITION CHAMBER

This application claims the benefit of U.S. Provisional Patent Application No. 61/214,800, filed Apr. 28, 2009, and U.S. Provisional Patent Application No. 61/216,093, filed May 13, 2009.

BACKGROUND OF THE INVENTION

1. Field of the Invention

The present invention relates generally to semi-conductor processing and optical coatings. Particularly, the present invention relates to physical vapor deposition onto substrates.

2. Description of the Prior Art

Electron beam evaporation is commonly used to coat wafers with a thin metallic layer in a process known as metallization. Generally, in typical silicon wafer fabrication, the metallic layer deposited is then etched to form circuit traces of an integrated circuit. For high frequency integrated circuits, gallium arsenide (GaAs), indium phosphide (InP) and numerous alloys between the two and similar electro-optical materials are now typically utilized as a substrate. Some metals, however, form a superficial oxide on their surface that is known in the art as the "skin effect." In circuits where high frequency power is used, this is a problem. This is critical especially for IC chips used in cellular devices since the skin effect increases power consumption.

Gold is often used as the conductor of integrated circuits because, as a passive metal, gold will not form a superficial oxide. Unfortunately, the use of gold presents other problems. The problems arise when the materials used as a substrate are ones other than silicon such as the gallium arsenide previously mentioned. There are two problems with depositing a gold layer directly upon a GaAs substrate. First, the gold will leach into the substrate. Second, the gold will not adequately adhere directly to the substrate. Therefore, in order to prevent the gold from leaching into the substrate, a diffusion barrier of palladium or platinum separates the gold from the GaAs. Additionally, an adhesion layer of titanium or chromium is deposited upon the GaAs substrate between the substrate and the diffusion barrier in order to make the gold, and the diffusion barrier adhere to the substrate. These barrier and adhesion layers must typically be very thin yet very uniform.

Unlike gold circuit traces on a silicon substrate, the gold circuit traces cannot be etched away from the GaAs substrate in a typical etching process because the etchant would remove the adhesion layer and diffusion barrier thus freeing the circuit trace from the substrate. This is a clearly undesirable consequence. Therefore, the gold circuit traces are typically made according to a "lift-off" process, all as is well known in the art. To use this process, a source of metal to be deposited must achieve a trajectory as close to 90 degrees with respect to the substrate surface as possible. This is referred to as orthogonal deposition and the optimal resultant coating is referred to as a "lift-off" coating or as zero step coverage. A commonly used method of physical vapor deposition in lift-off processes is electron beam evaporation. In practical applications where multiple wafers must be precisely coated by a single source, this requires complex machinery with specific setups for specific power levels and materials. Examples of these complex systems are disclosed.

U.S. Patent Application Publication No. 2003/0180462 (2003, Chang et al.) discloses a planetary lift-off vapor deposition system. The system incorporates multiple domes mounted in a square or rectangular vacuum chamber with a planar top wall and a planar bottom wall. The multiple domes rotate about the source centerline axis and about another second axis of rotation in order to assure an even coating on the target wafers and to utilize a larger percentage of material evaporated from the source compared to single dome systems. The system is configured to produce orthogonal lift-off coatings without the use of a uniformity mask.

The advantage of the Chang et al. system is the use of multiple domes in a planetary configuration to achieve a process that is less sensitive to process variations such as evaporant material, power level, beam position, and the like without the use of a uniformity mask. Although the Chang device provides for some improvement in collection efficiency over a single-dome system, the disadvantage of the Chang et al. system is there is still waste of evaporant material on surfaces other than the target wafers.

U.S. Pat. No. 3,858,547 (1975, Bergfelt) discloses a coating machine having an adjustable rotation system. The coating machine has a cylindrical-shaped vacuum chamber with a planar top wall and a planar bottom wall. At least one coating source is included therein. The coating source is located in a resistance heated boat arranged in a 12-inch circle. A plurality of spindle assemblies is mounted in the chamber with each of the spindle assemblies having a rotatable spindle. A substrate holder is carried by each spindle and is adapted to carry a substrate in such a manner that it is adapted to receive coating material from the coating source. Means is provided for rotating the spindle assemblies about the source and for rotating the spindles about their own axes at the same time they are being rotated about the source. Additionally, means is provided to permit adjustment of the spacing of the spindle assemblies from the center of rotation about the source. In addition, means is provided to permit adjustment of the angle of the spindle with respect to the coating source to thereby adjust the angle of incidence of the vapor coating stream with respect to the substrates carried by the spindles.

The disadvantage of the Bergfelt device is that the spindle assemblies must be adjusted depending on where the coating source boat is located in the 12-inch circle. This reduces throughput of the number of wafers because of the additional set up time required. Although the Bergfelt device offers an improved efficiency over the single-dome system, it still suffers from a waste of evaporant material on surfaces other than the target wafers on the spindle assemblies.

U.S. Pat. No. 3,643,625 (1972, Mahl) discloses a thin-film deposition apparatus having a holder and a plurality of racks. Each of the racks has a surface that has the conformation of a portion of the surface of a sphere. A structure is provided for rotatably mounting the racks on the holder in such a manner that the surfaces of the racks lie generally on the surface of a common sphere. A drive mechanism is provided for rotating the holder upon an axis centrally disposed with respect to the racks and for rotating the racks about their own axes of rotation with respect to the holder. A source of the material appears to be positioned on approximately the surface of the sphere or further from the racks.

A disadvantage of the Mahl device is that locating the source of material on or further than the surface of the sphere requires a much larger size of the vacuum chamber. By using a larger vacuum deposition chamber, a larger amount of exposed surface area is available for receiving the evaporated source material that is not deposited on the surfaces intended to receive the film coating. Furthermore, the wafers are not orthogonal to the evaporant source, thus making it unacceptable for use with a "lift-off" process.

Therefore, what is needed is an electron beam coater capable of the orthogonal deposition necessary for lift-off applications that is less sensitive to process variations such as evaporant material, power level, beam position, and the like. What is also needed is an electron beam coater that is more efficient.

SUMMARY OF THE INVENTION

The apparatus and method of the present invention deposits a uniform "lift-off" coating on a large amount of wafers in a short period of time. In comparison with prior vapor deposition devices and methods, the apparatus and method of the present invention utilize a greater percentage of the vaporized material, do not require that any components be changed when vaporizing different materials, and reliably and consistently deposits a more uniform and precise coating.

The present invention provides the potential for advances in lift-off processing to be obtained by the unique combination of innovative technologies that include optimizing the collection efficiency of a conventional single-axis-of-rotation dome to obtain the highest operating efficiencies achievable using a single uniformity mask (for a single deposited material) or multiple masks (for multiple layered materials), multiplying these efficiency improvements by applying the same packing density principles to an advanced HULA (High Uniformity Lift-off Assembly) substrate holder, and replacing the conventional box-shaped deposition chamber with a cone-shaped chamber. Transitioning from a box-shaped deposition chamber to a conic chamber promises vast pumping advantages because of reduced surface area and volume. Employing either a hyperefficient dome or an advanced HULA substrate holder in a conic chamber creates a unique set of integrated technical innovations. This unique set of integrated technical innovations indicate that the conic chamber will yield improvements in pumping efficiency up to about 50%, and that the use of the conic chamber plus the advanced HULA provides throughput improvements approaching 40%.

Collection efficiency means the percentage of evaporated material that is deposited on the wafers. For a single-axis-of-rotation substrate holder, or dome, collection efficiency is a determined by the uniformity mask(s) required by the process, the diameter of the dome, the packing density of substrates on the dome, and match between the shape of the evaporant cloud and the spherical dome.

The evaporated material travels from the source in a straight line toward the wafers held by the substrate holder dome. The evaporant vector field or vapor cloud, however, is not uniform. If the dome and its contained wafers were stationary, variations in the cloud would result in an extremely uneven coating distribution on the wafers. Rotation of the dome about the source center line averages the variations that occur in a circular path around the center line and so reduces the cloud's unevenness considerably. Even with the dome rotating, however, a substantial source of nonuniformity remains. Coating thickness is greatest near the source centerline and decreases as the distance of the wafer from the source centerline increases. In order to reduce the thickness of the coating deposited nearest to the source centerline, a stationary uniformity mask, whose width tapers off with increasing radius, is mounted between the source and the dome. As the dome rotates, the uniformity mask blocks a larger portion of the vapor near the centerline than it does far from the centerline. A unique uniformity mask must be custom tailored for the evaporant material and for the other evaporation conditions that significantly affect vapor cloud shape. When a well designed uniformity mask is added to the system, the uniformity mask brings the overall coating uniformity within acceptable limits. Unfortunately, the mask necessarily limits the average coating thickness to the lowest level achieved by unmasked deposition at the outermost edge of the dome's outer row of wafers.

Optimizing the trade-off between on-mask collection and on-dome collection is essential for overall collection efficiency. The key to optimizing that trade-off is to determine the dome diameter at which on-mask collection begins to overtake on-dome collection. The following equation represents this trade-off mathematically.

$$T_p = \frac{T_o \cos^n \vartheta \cos \phi}{R^2} \quad (1)$$

where:
$T_p$=Coating thickness at point p
$T_o$=Coating thickness for $v=0$, $\phi=0$, $R=1$
$v$=The emission angle, that is, the angle between the source center line and a line drawn from the virtual source to the point under consideration
$\phi$=The vapor's angle of incidence at the point in question, that is, the angle between a line drawn perpendicular to the wafer's underside and the vapor's actual trajectory at that point
R=Dome spherical radius=Distance from virtual source to any point on dome's spherical surface
n=A value calculated after the values of $v$, $\phi$, and R have been determined In physical terms, the three factors that determine coating thickness are the material being evaporated, the evaporation rate and the temperature of the virtual source. Those three factors, in turn, are functions of the following additional variables. These variables include the electron beam gun's emission current, crucible size, the use or nonuse of a crucible liner, the level of the evaporant pool within the crucible, the beam spot size, the position of beam spot, if stationary, on the surface of the evaporant material pool, the use or nonuse of beam sweep, and the optimization of beam sweep pattern for the material in question. By themselves, some of these factors have a relatively negligible effect. Under processing conditions in which the relatively minor factors compound each other, their cumulative effect, however, can be significant.

All of the above, in turn, is dependent on the vapor cloud shape of the evaporant material. In physical terms, the primary determinants of vapor cloud shape are the evaporant material and the evaporation rate, which is largely a function of the power applied by the e-beam gun. Vapor cloud research by the inventors has demonstrated that $\cos^n$ in the above equation provides a precise index of vapor cloud shape. Vapor clouds based on low values of n tend to be short and oblate. As the value of n increases, the vapor cloud shape becomes elongated and more teardrop shaped. The inventors' vapor cloud research has also revealed that for many materials the deposition rate falls off nonlinearly as a function of distance from the virtual source, assuming that the evaporation rate remains constant. Understanding the vapor cloud shape for the material being deposited enables optimization of the uniformity mask which is created and used to insure coating uniformity across a full dome load (or batch) of wafers. The inventors' vapor cloud and depositions research has also allowed them to determine empirically the maximum dome diameter or size upon which on-mask collection overtakes on wafer collection for a particular radius of curvature dome. A single axis dome will reach its maximum collection efficiency in terms of size (wafer capacity) beyond this limit as more deposition material will be lost to the uniformity mask than is incrementally collected on wafers in the dome. Optimization of that match is the final factor in the optimization of collection efficiency.

The HULA (High Utilization Lift-Off Assembly) planetary substrate holder was designed to minimize the losses in collection efficiency inherent in uniformity mask usage with single dome systems. The uniformity masks required in such systems typically collect 10-12% of the evaporated material. Current HULA configurations consist of several planetary domes with no central dome. Such HULA systems require no uniformity mask, therefore realizing a 10-12% improvement in collection efficiency. An additional benefit of the HULA system is that it is much less sensitive than a single dome system to any process variable that affects vapor cloud shape (e.g., evaporant material, deposition rate, or beam position). The HULA planetary system thus enables depositing one or more uniform lift-off coatings on a large number of wafers in a shorter period of time, in comparison with single-dome deposition systems that require the use of larger uniformity masks.

The present invention is an advanced HULA concept that includes a ring of planetary domes surrounding a central dome of the same size. In this configuration, the HULA system requires only a very small mask to make the central dome's coating thickness and uniformity match those of the outer domes. The mask required for the central dome is smaller than that of a typical single dome system not only because the former is much smaller than the latter, but also because the mask for the central dome must only average that dome's coating thickness to match that of the center line of the wafers in the satellite domes.

Furthermore, the use of conic deposition chambers offers reductions of up to 50% in pumpdown times, compared with conventional box-shaped chambers holding the same diameter wafer carriers. This reduction in pumpdown times has obvious benefits for aggregate cost of operation (COO). Additional COO reductions will result from the following factors. Conic section volumes are 42% less than equivalent box volumes. Reduced volume yields reduced pumping requirements plus the possibility of energy savings through the use of smaller pumps. Conic section surfaces are 30% less than equivalent box surfaces. Where outgassing from surfaces is responsible for a significant volume of the gaseous material that must be evacuated from the chamber, this reduction of surface area yields much of the predicted 50% improvement in pumpdown times. The conic shape of the vacuum deposition chamber offers reduced shielding requirements because the chamber walls do not present their surfaces for ready deposition but fall away from the flux angle. Savings are realized and compounded for every batch cycle operation.

Other advantages of the present invention include the following. Conic chambers may be fabricated by a hydroform process, so their overall manufacturing cost would be much less than the cost of manufacturing thick, heavily reinforced, and welded cubes. Compared with box-shaped chambers, conic chambers use less material and are lighter and easier to ship. The cost of cleaning, maintaining, and replacing deposition shields is greatly reduced. The conic chamber shape makes it possible to integrate the ancillary pumps, pneumatics, and electronics within a compact cylinder whose diameter is defined by the cone's upper diameter. Cryopumps can be mounted facing away from the gun, the source of heat in the deposition chamber, and upward, so that they are below the chamber's main volume. This position would benefit high-conductance pumping. Improvements in pumping efficiency may make it possible to downsize pumps significantly, reducing initial system cost and the energy required to operate the pumps over time.

Furthermore, improvements in collection efficiency will yield significant improvements in COO in specific applications, particularly those involving deposition of gold and other precious metals. Currently, most of the gold that is consumed in coating processes is deposited either on internal shields or on top of the photoresist-covered substrates. When the liftoff process is complete, only about 10% of the gold remains deposited on the substrates. The chamber shields and liftoff residues go to gold reclaimers, who typically charge a percentage of the gold's original value as their fee. For users whose processes require gold deposition, the expense of buying and managing their inventory of gold can run to hundreds of thousands of dollars per month. Therefore, a key goal of the present invention is to reduce the amount of metal deposited on any surface other than that of the substrates. As a higher percentage of the gold flux is deposited on the wafers, the duration of each deposition run is shortened, so throughput is improved. An additional improvement in throughput would result from the reduction of the time required to change shields, which are much smaller in the conic design than in a box-shaped coater.

The present invention achieves these and other objectives by providing an apparatus for depositing a material on a substrate by evaporation using a lift-off process. In one embodiment of the present invention, the apparatus includes a conical-shaped housing, an evaporation source, one or more orbital dome-shaped members, a central dome-shaped member, a uniformity mask, and one or more wafer receiving positions/locations. The conical-shaped housing has a domed top, a bottom and a lateral wall that converges from the domed top towards the bottom. The evaporation source is positioned adjacent the bottom and aligned with a first axis that extends through the centerpoint of the domed top. The one or more orbital dome-shaped members is positioned above the evaporation source adjacent the domed top and at a constant radius from the first axis that extends through the centerpoint of the domed top. The one or more dome-shaped members rotate about the first axis while each orbital dome-shaped member simultaneously rotates about a second axis that extends through a centerpoint of that orbital dome-shaped member. The central dome-shaped member has a centerpoint aligned with the first axis and the central dome-shaped member rotates about the first axis. The uniformity mask is positioned between the evaporation source and the central dome-shaped member and is operationally engaged for use only with the central dome-shaped member. The one or more wafer receiving positions are located within each of the one or more orbital dome-shaped members and the central dome-shaped member for receiving a wafer therein.

In another embodiment of the present invention, the one or more wafer receiving positions are substantially orthogonal to the evaporation source.

In a further embodiment of the present invention, the apparatus includes a support structure that positions and rotates the one or more orbital dome-shaped members and the central dome-shaped member about the first axis.

In still another embodiment of the present invention, the apparatus includes a support structure where the support structure positions the one or more orbital dome-shaped members and the central dome-shaped member such that the arcs formed by the one or more orbital dome-shaped members and the central dome-shaped member are coincident with the circumference of a sphere having its center on the first axis and located at the evaporation source.

In another embodiment of the present invention, the apparatus includes a support structure that further includes a drive system that rotates the one or more orbital dome-shaped members about their respective second axis.

In another embodiment, the apparatus is a vapor deposition device using a lift-off process. The vapor deposition device includes an evaporation source, a support frame mounted for rotation about a first axis that passes through the evaporation source, one or more orbital dome-shaped members positioned above the evaporation source adjacent the domed top and at a constant radius from the first axis that extends through the centerpoint of the domed top, a central dome-shaped member, a uniformity mask, and one or more wafer receiving locations. The one or more dome-shaped members rotate about the first axis while each orbital dome-shaped member simultaneously rotates about a second axis that extends through a centerpoint of the orbital dome-shaped member. The central dome-shaped member has a centerpoint aligned with the first axis and the central dome-shaped member rotates about the first axis. The uniformity mask is positioned between the evaporation source and the central dome-shaped member and is operationally engaged for use only with the central dome-shaped member. The one or more wafer receiving locations is positioned within each of the one or more orbital dome-shaped members and the central dome-shaped member for receiving a wafer therein.

There is also disclosed a method of efficiently producing a lift-off coating on a wafer. In one embodiment, the method includes evaporating material from a source, rotating a central dome-shaped member about a first axis that passes through the center of the central dome-shaped member and the source, and rotating an orbital dome-shaped member that is offset from the central dome-shaped member about the first axis and rotating the orbital dome-shaped member about a second axis that passes through the center of the orbital dome-shaped member and the source. The central dome-shaped member has a wafer mounted thereon that is offset from the first axis and has a surface that is substantially orthogonal to the source. The orbital dome-shaped member has a wafer mounted thereon that is offset from the second axis and has a surface that is substantially orthogonal to the source.

In another embodiment of the present invention, the method includes rotating of the central dome-shaped member and the orbital dome shaped member about the first axis and the orbital dome-shaped member about the second axis simultaneously.

In another embodiment of the present invention, the method includes performing the steps of evaporating the material, rotating the central dome-shaped member and rotating the orbital dome-shaped member within a conical-shaped housing with a domed top, a bottom and a lateral wall that converges from the domed top towards the bottom. The evaporating of material is performed adjacent the bottom and the rotating of the central dome-shaped member and the orbital dome-shaped member is performed adjacent the domed top.

In another embodiment of the method of the present invention, there is disclosed a method of efficiently producing a lift-off coating on a wafer. The method includes evaporating material from a source, rotating a central dome-shaped member about a first axis that passes through the center of the central dome-shaped member and the source, and rotating an orbital dome-shaped member that is offset from the central dome-shaped member about the first axis and rotating the orbital dome-shaped member about a second axis that passes through the center of the orbital dome-shaped member and the source. The central dome-shaped member has a wafer mounted thereon that is offset from the first axis and has a surface that is substantially orthogonal to the source. The orbital dome-shaped member has a wafer mounted thereon that is offset from the second axis and has a surface that is substantially orthogonal to the source.

BRIEF DESCRIPTION OF THE DRAWINGS

FIG. 1 is an illustration of a side plan view of one embodiment of the present invention showing the conical-shaped housing.

FIG. 2 is an illustration of a partial top plan view of the embodiment shown in FIG. 1.

FIG. 5 is an illustration of a top plan view of the domes in a single-dome prior art device showing the configuration for collecting the maximum amount of material from the deposition.

FIG. 6 is an illustration of a top plan view of the domes in a three-dome arrangement of the prior art.

FIG. 7 is an illustration of a top plan view of the domes in a five-dome arrangement of the prior art for use without a uniformity mask.

DETAILED DESCRIPTION OF THE PREFERRED EMBODIMENT

Figure 3:
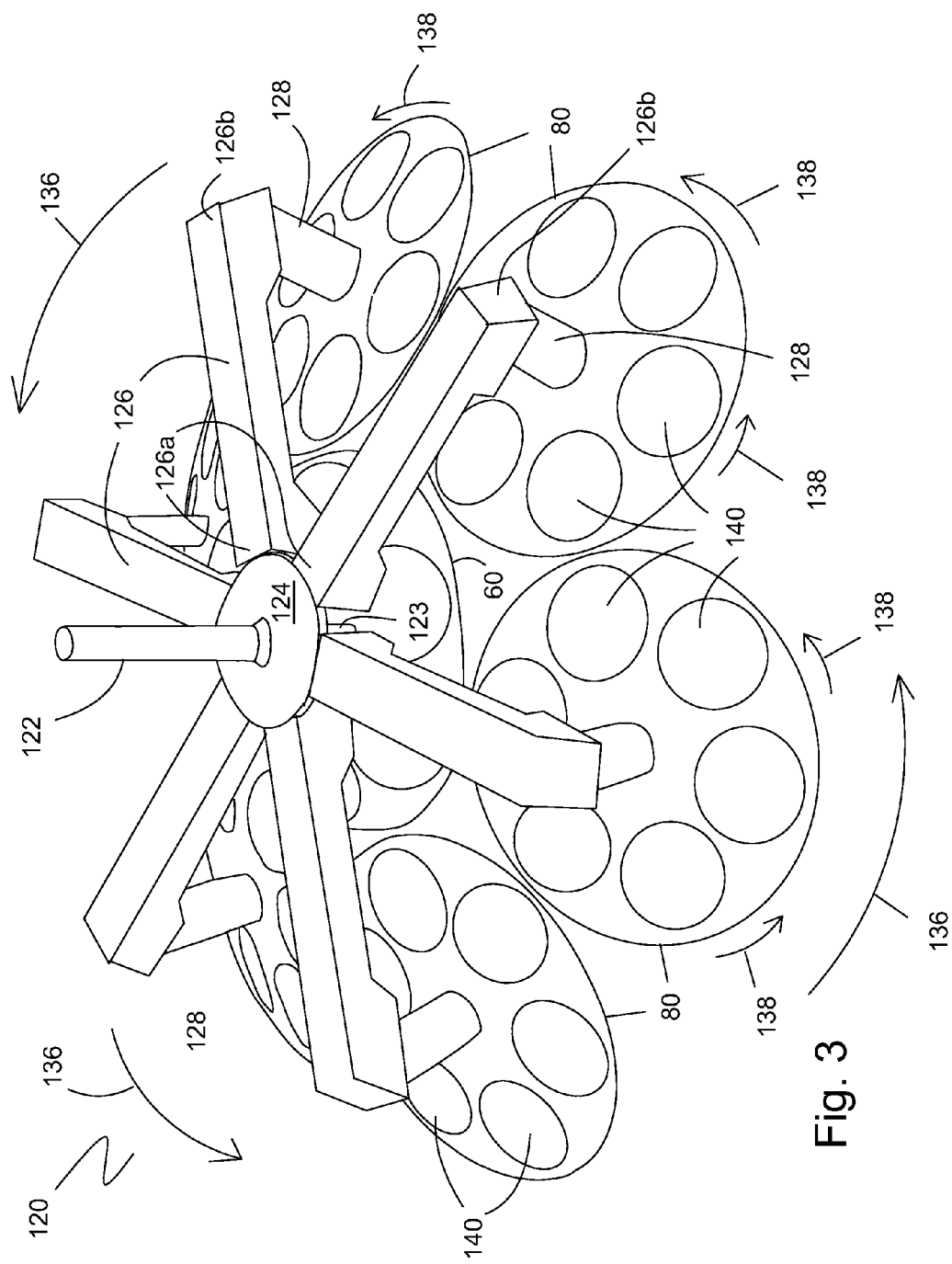
FIG. 3 is an illustration of a perspective view of one embodiment of the present invention showing the support structure for the central and orbital dome-shaped members.

The preferred embodiment of the present invention is illustrated in FIGS. 1-4. FIG. 1 illustrates a side plan view of a planetary lift-off deposition apparatus 10 of the present invention. Electron beam vapor deposition generally occurs in a vacuum. The apparatus 10 includes a sealed, vacuum, conical-shaped housing 20, an evaporation source 40, a central dome-shaped member 60, one or more orbital dome-shaped members 80, a support frame 120 (shown in FIG. 3), and a uniformity mask 100. Housing 20 includes a domed top 22, a bottom opening 24 and a lateral wall 26. Lateral wall 26 converges from domed top 22 towards bottom opening 24 defining a vacuum chamber 12. Evaporation source 40 is positioned adjacent bottom opening 24 and is aligned with a first axis 200. First axis 200 extends through a centerpoint 21 of domed top 22 and evaporation source 40.

Central dome-shaped member 60 has a centerpoint 61 that is aligned with first axis 200. Central dome-shaped member 60 is positioned with a concave surface 60a facing and above evaporation source 40 adjacent to domed top 22. Central dome-shaped member 60 is rotatably connected to support frame 120 (not shown) and rotates about centerpoint 61 and first axis 200.

One or more orbital dome-shaped members 80 is positioned with a concave surface 80a facing and above evaporation source 40 adjacent domed top 22 and at a constant radius from first axis 200 and/or centerpoint 21 of domed top 22. Orbital dome-shaped member 80 rotates about first axis 200 and also rotates about a second axis 210 that extends through a centerpoint 81 of orbital dome-shaped member 80 and evaporation source 40. The rotation of orbital dome-shaped member 80 about first axis 200 and about second axis 210 occurs simultaneously during operation.

Optionally and preferably, central dome-shaped member 60 and orbital dome-shaped member 80 have the same diameter and the same concavity. The concavity of central dome-shaped member 60 and orbital dome-shaped member 80 is substantially equal to the surface of a sphere having a radius equal to the distance between evaporation source 40 and centerpoints 60a, 80a of dome-shaped member 60, 80, respectively.

Uniformity mask 100 is positioned between evaporation source 40 and central dome-shaped member 60. Uniformity mask 100 in this example has a teardrop shape as shown in the magnified top view in FIG. 1. The head 101 of uniformity mask 100 is located at approximately the center of central dome-shaped member 60 and the narrower tail 102 located at approximately the peripheral edge of central dome-shaped member 60. The shape may vary according to the material being deposited, the power used and the distance between central dome-shaped member 60 and evaporation source 40, however, the wider portion of uniformity mask 100 is typically always toward the center of the central dome-shaped member 60 while the narrower end is typically always toward the peripheral edge. Uniformity mask 100 is operationally engaged for use only with central dome-shaped member 60 and is not used to mask and does not affect evaporant material deposition on orbital dome-shaped member 80. Orbital dome-shaped member 80 does not need a uniformity mask. Uniformity mask 100 is relatively small compared to the uniformity masks used with single dome systems and is only required to make the coating thickness and uniformity of central dome-shaped member 60 match those of orbital dome-shaped member 80. This provides improve collection efficiency and throughput.

Also illustrated in FIG. 1 is an isolation or gate valve 300 connected to deposition vacuum chamber 12 and a pair of source collars 310 for containing evaporation source 40.

Turning now to FIG. 2, there is shown a top plan view of the embodiment shown in FIG. 1. As can be seen, domed top 22 has circular shape with transverse wall 26 converging towards bottom opening 24 of housing 20.

FIG. 3 is a perspective view of support frame 120. Support frame 120 includes a primary drive shaft 122 that is rotatably connected to a drive component (not shown) to impart rotation and a frame hub 124. A drive shaft extension 123 is connected in operational and rotational alignment on one end with primary drive shaft 122. Drive shaft extension 123 is fixedly connected to central dome-shaped member 60 at the centerpoint 60a. A proximal arm end 126a of a plurality of extending arms 126 is attached to hub 124. Extending arms 126 are equally spaced from each other around hub 124. A secondary drive shaft 128 is rotatably connected adjacent a distal arm end 126b on one end and fixedly attached to one of the orbital dome-shaped members 80 at the centerpoint 80a of member 80. As can be seen, each of the central and orbital domed-shaped members 60, 80, respectively, has a plurality of wafer receiving positions 140. Preferably, each of the plurality of wafer receiving positions 140 are openings for receiving the wafers therein. In the preferred embodiment, support frame 120 has six arms 126 supporting six orbital or planetary dome-shaped members 80 using secondary drive shaft 128 and a central dome-shaped member 60 supported by drive shaft extension 123. The drive component is operationally connected to primary drive shaft 122 to cause primary drive shaft 122 to rotate as indicated by arrows 136. This causes orbital dome-shaped members 80 to rotate about first axis 200 of primary drive shaft 122 in a planetary motion as well as to impart rotational motion to central dome-shaped member 60 connected to drive shaft extension 123. The drive component is also operationally connected to secondary drive shaft 128 to cause secondary drive shaft 128 to rotate as indicated by arrows 138. This causes orbital dome-shaped members 80 to rotate about second axis 210 of secondary drive shaft 128. Accordingly, orbital dome-shaped member 80 is simultaneously rotating about second axis 210 while rotating about first axis 200.

Each of central dome-shaped member 60 and orbital dome-shaped member 80 includes one or more wafer receiving positions 140 for receiving a wafer to be coated with evaporant material. Wafer receiving position 140 is configured to position a wafer substantially orthogonal to evaporation source 40. Wafer receiving position 140 may be openings or recesses or mounting platforms for holding a wafer. A releasable retaining mechanism (not shown) holds a wafer in position during a coating operation, all as is well known in the art.

Figure 4:
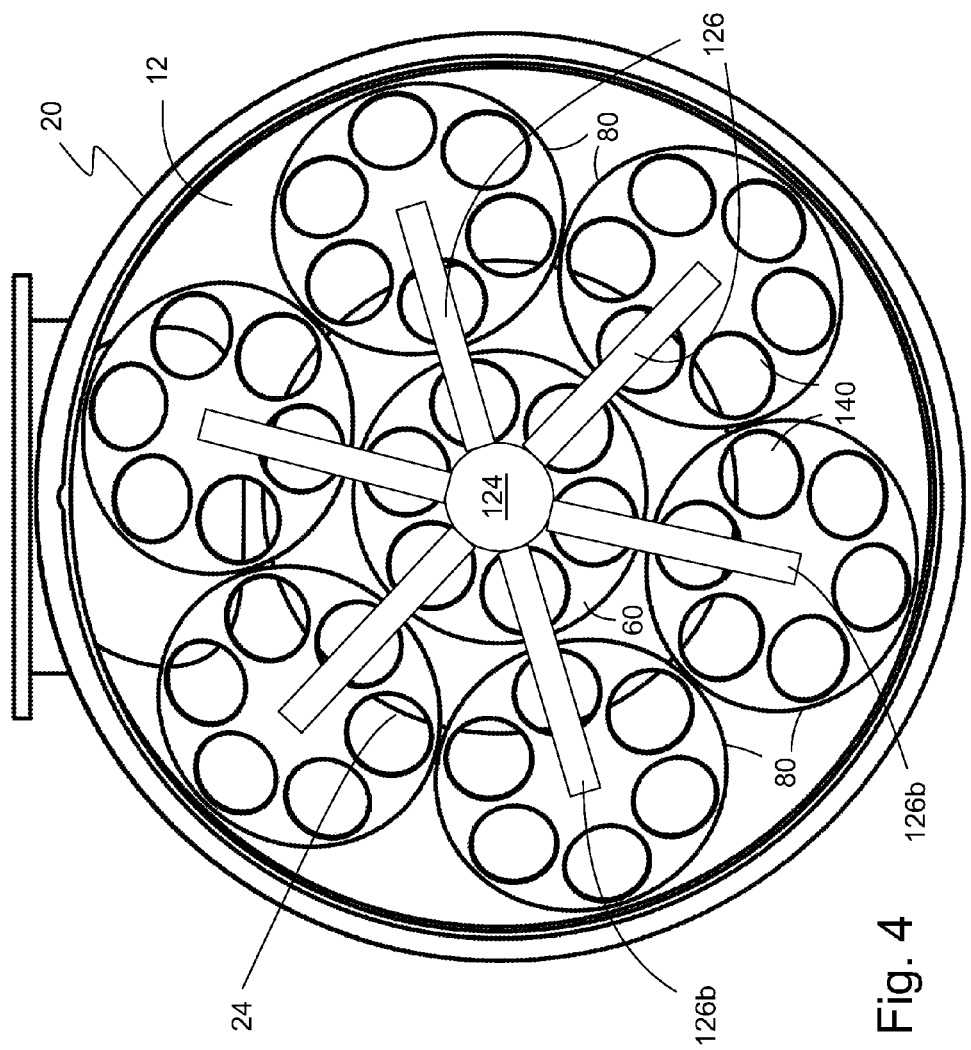
FIG. 4 is an illustration of a top plan view of one embodiment of the present invention showing the relative positions of the central and orbital dome-shaped members within the conical-shaped housing.

FIG. 4 is a top, flattened view of the support frame and dome-shaped members in the vacuum chamber. For clarity, the illustration is simplified in order to better understand the structural relationship of the main components of the plurality of dome holders. In this embodiment, support structure 120 has hub 124 and six extending arms 126. Drive shaft extension 123 (not shown) supports central dome-shaped member 60 and secondary drive shafts 128 (not shown) adjacent distal ends 126b operationally connects each of the six extending arms 126 and supports orbital dome-shaped members 80. The described structure is positioned within vacuum chamber 12 below but adjacent domed top 22 of conical housing 20. Each of central and orbital dome-shaped members 60, 80 are substantially the same size and positioned so that no uniformity mask is used between any of the six orbital dome-shaped members 80. A uniformity mask 100 (not shown) that is relatively smaller that the mask used in a single dome system is used between the coating surface of central dome-shaped member 60 and evaporation source 40. Uniformity mask 100 required for central dome-shaped member 60 is smaller than that of a typical single dome system not only because the former is much smaller than the latter, but also because uniformity mask 100 for central dome-shaped member 60 must only average that dome's coating thickness to match that of orbital dome-shaped member 80 at centerpoint 80a and the centerpoints or center lines of the wafers in the orbital or satellite dome-shaped members 80.

For comparison purposes, FIGS. 5-7 illustrate prior art dome systems, which all use box-shaped vacuum chambers. FIG. 5 illustrates a single dome system in a box-shaped vacuum chamber. FIG. 6 illustrates a three dome satellite system in a box-shaped vacuum chamber. It is important to note that the shaded wafer positions if used would require several uniformity masks to more evenly create a consistent coating layer across each dome. FIG. 7 illustrates a five dome satellite system in a box-shaped vacuum chamber where no uniformity mask is required.

Examples of the coating efficiencies will now be presented. The first example illustrates the coating efficiency of a single dome system.

Example 1

The system includes a conventional, segmented, lift-off dome system available from Ferrotec-Temescal of Livermore, Calif., as Model FC4400 using a 42 inch wide, single dome. The wafer size was 5.825 inches in diameter. The coating process uses 30 wafer segmented TP8 dome with a 30° ½ angle vapor angle.

TABLE 1

| Dome Radius (in) | Dome Width (in) | Vapor Angle (degrees) | Dome Surface (in²) | Collection on Dome (%) | Wafer Count | Wafer Surface (in²) | Collection on Wafer (%) |
|---|---|---|---|---|---|---|---|
| 42 | 42 | 30 | 1484.91 | 35.45 | 30 | 799.47 | 19.08 |

As can be seen from Table 1, the single dome system has a paltry 19.08 percent collection on the wafer. This means that 80.92 percent of the evaporant material is wasted and collected on the single dome, shields and the walls of the box-shaped vacuum chamber.

Example 2

The system includes a conventional, non-segmented, single axis lift-off dome system however made as large as possible to still collect the maximum amount of material from the deposition. FIG. 5 represents an illustration of such a single dome. This is modeled using a 53 inch wide dome. The wafer size was 5.825 inches in diameter. The coating process uses 60 wafers with a 39° ½ angle vapor angle. This size of single axis dome, however, is not practical from an ergonomic manufacturing standpoint since the dome would typically be composed of multiple sections to facilitate removal of the wafers from the vacuum chamber. To accomplish this, there would necessarily be a concurrent reduction in total wafer count from 60 to 50 with a proportional reduction in the percent collected on the wafer.

TABLE 2

| Dome Radius (in) | Dome Width (in) | Vapor Angle (degrees) | Dome Surface (in²) | Collection on Dome (%) | Wafer Count | Wafer Surface (in²) | Collection on Wafer (%) |
|---|---|---|---|---|---|---|---|
| 42 | 53 | 39 | 2484.69 | 42.45 | 60 | 1598.94 | 27.32 |

As can be seen from Table 2, the largest and most efficient standard single axis dome has a 27.32 percent collection on the wafer. This means that 72.68 percent of the evaporant material is wasted and collected on the non wafer portions of the dome, shields and the walls of the box-shaped vacuum chamber. This is performed with a uniformity mask and shows an improvement in collection efficiency over the conventional size single dome system.

Example 3

FIG. 7 is an illustration of a prior art HULA system with 5 domes. An example of one such system is available from Ferrotec-Temescal as Model No. HUHY-54 using a 49 inch wide dome with 5 orbital dome-shaped members 80. The wafer size was 5.825 inches in diameter. The coating process uses 30 wafers on 5 orbital domes with a 36° ½ angle vapor angle.

TABLE 3

| Dome Radius (in) | Dome Width (in) | Vapor Angle (degrees) | Dome Surface (in²) | Collection on Dome (%) | Wafer Count | Wafer Surface (in²) | Collection on Wafer (%) |
|---|---|---|---|---|---|---|---|
| 42 | 49 | 36 | 1398.22 | 36.72 | 30 | 799.47 | 21.00 |

Table 3 indicates a collection on wafer of 21% and an advantage of the prior art HULA system over the single dome system having a 30-wafer count. This means that 79 percent of the evaporant material is wasted and collected on the satellite domes, shields and the walls of the box-shaped vacuum chamber. This represents a 16.18% improvement on collection efficiency over the table 1, 30 wafer single axis dome with a mask. As noted earlier, the mask costs approximately 11% to 12% in efficiency. By removing the mask and configuring as above, there is not only a gain of all of the mask losses but also a contribution of an additional 3%-4%.

Example 4

One embodiment of a system of the present invention includes a conventional lift-off HULA dome system available from Ferrotec-Temescal as Model No. HUHY-54 using a 54 inch wide dome with 6 orbital dome-shaped members 80 and a central dome-shaped member 60. FIG. 4 is an illustrative example of such a system. The wafer size was 5.825 inches in diameter. The coating process uses 42 wafers, 6 orbital domes plus one central dome with a 36° ½ angle vapor angle.

TABLE 4

| HULA Radius (in) | HULA Width (in) | Vapor Angle (degrees) | HULA Surface (in$^2$) | Collection on HULA (%) | Wafer Count | Wafer Surface (in$^2$) | Collection on Wafer (%) |
|---|---|---|---|---|---|---|---|
| 42 | 54 | 40 | 1957.51 | 52.39 | 42 | 1119.26 | 29.95 |

As can be seen from Table 4, the present invention system has a 29.95 percent collection on the wafers. This means that only 70.05 percent of the evaporant material is wasted and collected on the central and satellite domes, shields and the walls of the conical-shaped vacuum chamber. Also note this collection efficiency is achieved with a total wafer load of only 42 wafers in comparison to the larger 60 wafer conventional single axis example of Table 2. This is performed without a uniformity mask for the satellite domes and a relatively small uniformity mask for the central dome. This indicates a further improvement in collection efficiency over the single dome system and prior art HULA systems not using a conventional central dome. As a higher percentage of the gold flux is deposited on the wafers, the duration of each deposition run is shortened, so throughput is improved. The smaller and uniformly shaped orbital and central wafer domes act also as natural carriers for clustered wafer loading and unloading in a fast exchange process. This ergonomic factor speeds the load/unload cycle taking it off line or making it possible through use of a spare set of carriers to have domes loaded and unloaded outside the vacuum pump-down step. Furthermore, the pump-down times are shorter, which also improves throughput. Throughput means the number of wafers coated per given period of time.

In addition to the collection efficiency and the associated costs of material, storage and handling, the reduced volume of the conical housing provides additional benefits not realized by the prior art systems. These benefits include other advantages. These advantages are that conic chambers may be fabricated by a hydroform process, so their overall manufacturing cost would be much less than the cost of manufacturing thick, heavily reinforced, and welded cubes. Compared with box-shaped chambers, conic chambers use less material and are lighter and easier to ship. The cost of cleaning, maintaining, and replacing deposition shields is greatly reduced. The conic chamber shape makes it possible to integrate the ancillary pumps, pneumatics, and electronics within a compact cylinder whose diameter is defined by the cone's upper diameter. Cryopumps can be mounted facing away from the gun, the source of heat in the deposition chamber, and upward, so that they are below the chamber's main volume. This position would benefit high-conductance pumping. Improvements in pumping efficiency may make it possible to downsize pumps significantly, reducing initial system cost and the energy required to operate the pumps over time. An additional improvement in throughput also results from the reduction of the time required to change shields, which are much smaller in the conic design than in a box-shaped coaters.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An apparatus for depositing a material on a substrate by evaporation that produces substrates capable of undergoing a lift-off process post substrate completion, the apparatus comprising:

a conical-shaped housing with a domed top, a bottom with a bottom opening, a sloping lateral wall that converges linearly from the domed top towards the bottom, and an interior, the interior having a processing pressure of $10^{-6}$ to $10^{-7}$ torr;

an evaporation source containing an evaporant material positioned adjacent the bottom and aligned with a first axis that extends through a center of the domed top, the evaporation source being positioned substantially at a centerpoint of a sphere which centerpoint is located on the first axis;

a central dome-shaped member positioned above the evaporation source and adjacent the domed top, the central dome-shaped member having a center on the first axis and located a predefined distance from the evaporation source on the first axis wherein the predefined distance is substantially equal to a radius of the sphere wherein the central dome-shaped member rotates about the center and the first axis;

one or more orbital dome-shaped members positioned above the evaporation source and adjacent the domed top but offset from the first axis, the one or more orbital dome-shaped members located a predefined distance from the evaporation source that is substantially equal to the radius of the sphere wherein the one or more orbital dome-shaped members rotate about the first axis and wherein each orbital dome-shaped member simultaneously rotates about a second axis that extends through a center of the orbital dome-shaped member to the evaporation source, the one or more orbital dome-shaped members being substantially equal in diameter and concavity to the central dome-shaped member, the evaporation source being positioned at the centerpoint;

a stationary uniformity mask located in a fixed position between the evaporation source and the central dome-shaped member, the uniformity mask being a single uniformity mask and having a width that tapers from a predefined width to a narrower width with increasing radius from the first axis of the central dome-shaped member and operationally affecting only the central dome-shaped member, wherein the stationary uniformity mask is shaped to define a resultant central dome deposition distribution of the evaporant material that is substantially uniform; and one or more wafer receiving positions located within each of the one or more orbital dome-shaped members and the central dome-shaped member for receiving a wafer therein, each of the plurality of wafer positions configured to orient a substrate surface of a wafer mounted therein substantially orthogonal to a linear trajectory from the evaporation source to the substrate surface during rotation about the first axis and the second axis, wherein each of the orthogonal wafer positions holds a substrate in a processing vacuum of $10^{-6}$ to $10^{-7}$ torr, which substrate is capable of undergoing a lift-off process after vapor deposition, and wherein a resultant orbital dome distribution of the evaporant material from the evaporation source is substantially equal to the resultant central dome distribution.

2. The apparatus of claim 1 wherein the one or more wafer receiving positions are substantially orthogonal to the evaporation source.

3. The apparatus of claim 1 further comprising a support structure that positions and rotates the one or more orbital dome-shaped members and the central dome-shaped member about the first axis.

4. The apparatus of claim 3 wherein the support structure positions the one or more orbital dome-shaped members and the central dome-shaped member wherein the arcs formed by the one or more orbital dome-shaped members and the central dome-shaped member are coincident with the circumference of a sphere having its center on the first axis and located at the evaporation source.

5. The apparatus of claim 3 wherein the support structure includes a drive system that rotates the one or more orbital dome-shaped members about their respective second axis.

6. The apparatus of claim 1 wherein the one or more orbital dome-shaped members equals six orbital dome-shaped members.

7. A vapor deposition device that produces substrates capable of being processed post substrate formation using a lift-off process, the device comprising:
an evaporation source;
a support frame mounted for rotation about a first axis that passes through the evaporation source;
a central dome-shaped member having a predefined concavity and mounted to the support frame wherein a center of the central dome-shaped member is aligned with the first axis and positioned away from the evaporation source, the evaporation source being positioned at a centerpoint of a sphere having a concavity substantially equal to the predefined concavity of the central dome-shaped member and having a radius substantially equal to a distance between the evaporation source and the central dome-shaped member, the central dome-shaped member having a single stationary uniformity mask located in a fixed position between the evaporation source and the central dome-shaped member wherein the fixed position causes the stationary uniformity mask to operationally affect only the central dome-shaped member, the uniformity mask having a width that tapers from a predefined width to a narrower width with increasing radius away from the first axis of the central dome-shaped member and wherein the stationary uniformity mask is shaped to define a resultant central dome deposition distribution across the central dome-shaped member that is substantially uniform;

an orbital dome-shaped member mounted to the support frame in a position offset from the first axis and rotatable about a second axis that passes through a center of the orbital dome-shaped member, the orbital dome-shaped member being located at a distance substantially equal to the radius of the sphere from the centerpoint wherein the orbital dome-shaped member defines a resulting orbital dome deposition distribution across the orbital dome-shaped member that is substantially equal to the central dome deposition distribution; and a plurality of wafer positions on the central dome-shaped member and the orbital dome-shaped member wherein each of the wafer positions are offset from the first axis and the second axis, each of the plurality of wafer positions orients a substrate surface of a wafer mounted therein substantially orthogonal to a linear trajectory extending from the evaporation source to the substrate surface during rotation about the first axis and the second axis, and wherein each of the orthogonal wafer positions holds a substrate in a processing vacuum of $10^{-6}$ to $10^{-7}$ torr thereby forming substrates for processing using the lift-off process.

8. The device of claim 7 further comprising a conical-shaped housing with a domed top, a bottom with a bottom opening and a sloping lateral wall that converges linearly from the domed top towards the bottom, the conical shaped housing enclosing the evaporation source adjacent the bottom opening and the support frame, the central dome-shaped member and the orbital dome-shaped member positioned adjacent the domed top.

9. The device of claim 7 wherein the support frame includes a drive system that rotates the central dome-shaped member and the orbital dome-shaped member about the first axis and the orbital dome-shaped wafer holder about the second axis.

10. The device of claim 7 wherein each of the plurality of wafer positions is a wafer receiving opening.

11. A vapor deposition device that produces substrates capable of being processed using a lift-off process comprising:
an evaporation source positioned at a centerpoint;
a central means for positioning one or more wafers wherein the center of each of the one or more wafers is at a constant radius from the centerpoint and substantially orthogonal to a linear trajectory from the evaporation source to each of the one or more wafers, the central means being dome-shaped rotates the one or more wafers about a first axis that passes through a center of the central means and the evaporation source wherein the central means has a single stationary uniformity mask located in a fixed position between the evaporation source and the central means and wherein the stationary uniformity mask operationally affects only the central means and wherein the stationary uniformity mask is shaped to define a resultant central means deposition distribution across the central means that is substantially uniform;

an orbital means for positioning one or more wafers that is offset from the central means and wherein a center of each of the one or more wafers of the orbital means is at the constant radius from the centerpoint and substantially orthogonal to a linear trajectory from the evaporation source to each of the one or more wafers, the orbital means being dome-shaped rotates the one or more wafers about a second axis that passes through a center of the orbital means and the evaporation source, and wherein the orbital means for positioning the one or more wafers holds the wafers in a processing vacuum of $10^{-6}$ to $10^{-7}$ torr during vapor deposition and has a resulting orbital deposition distribution across the orbital means that is substantially equal to the central means deposition distribution; and a means for rotating the central means and the orbital means about the first axis and for rotating the orbital means about the second axis wherein the central means and the orbital means are positioned above the evaporation source whereby the vapor deposition device produces wafers capable of being processed using a lift-off process.

12. The device of claim 11 wherein the central means for positioning, the orbital means for positioning and means for rotating rotate the one or more wafers about the first axis and the second axis simultaneously.

13. The device of claim 11 further comprising a conical-shaped housing with a domed top, a bottom with a bottom opening and a sloping lateral wall that converges from the domed top towards the bottom opening, the conical-shaped housing enclosing the evaporation source adjacent the bottom opening and the central means for positioning, the orbital means for positioning and the means for rotating adjacent the domed top.

14. The device of claim 11 wherein the orbital means includes six orbital dome-shaped members.

15. The device of claim 11 wherein the central means includes one central dome-shaped member.

16. A method of efficiently producing a lift-off coating on a wafer by a deposition apparatus of claim 1, the method comprising:

evacuating a conical-shaped housing having a domed top, a bottom with a bottom opening and a sloping lateral wall that converges linearly from the domed top towards the bottom, the evacuated conical-shaped housing having an operating pressure of $10^{-6}$ to $10^{-7}$ torr;

evaporating material from an evaporation source positioned at a centerpoint located adjacent the bottom;

rotating a central dome-shaped member having a concavity substantially equal to a sphere whose radius is substantially equal to the distance between the central dome-shaped member and the evaporation source, the central dome-shaped member being spaced from the evaporation source about a first axis that passes through a center of the central dome-shaped member and the centerpoint and positioned away from the evaporation source with a stationary uniformity mask disposed between the evaporation source and the central dome-shaped member wherein the uniformity mask operationally affects only the central dome-shaped member and wherein the stationary uniformity mask is shaped to define a resultant deposition distribution of the central dome-shaped member that is substantially uniform, the central dome-shaped member having a wafer mounted thereon that is offset from the first axis and having a surface that is substantially orthogonal to the evaporation source; and rotating an orbital dome-shaped member that is offset from the central dome-shaped member about the first axis and rotating the orbital dome-shaped member about a second axis that passes through a center of the orbital dome-shaped member and the evaporation source, the orbital dome-shaped member having a concavity substantially equal to the concavity of the central dome-shaped member and being located at a distance substantially equal to the distance between the central dome-shaped member and the evaporation source, the orbital dome-shaped member having a wafer mounted thereon that is offset from the second axis and having a surface that is substantially orthogonal to the evaporation source and wherein orbital dome-shaped member holds the wafer in a processing vacuum of $10^{-6}$ to $10^{-7}$ torr whereby the method produces wafers capable of being processed using a lift-off process and wherein the orbital dome-shaped member has a resultant orbital deposition distribution that is substantially equal to the central dome-shaped member deposition distribution.

17. The method of claim 16 wherein the rotating of the central dome-shaped member and the orbital dome shaped member about the first axis and the orbital dome-shaped member about the second axis occurs simultaneously.

18. The method of claim 16 further comprising performing the steps of evaporating the material, rotating the central dome-shaped member and rotating the orbital dome-shaped member within a conical-shaped housing with a domed top, a bottom with a bottom opening and a sloping lateral wall that converges from the domed top towards the bottom wherein the evaporating of material is performed adjacent the bottom opening and the rotating of the central dome-shaped member and the orbital dome-shaped member is performed adjacent the domed top.

* * * * *